United States Patent
Tohyama et al.

(10) Patent No.: US 8,007,334 B2
(45) Date of Patent: Aug. 30, 2011

(54) DISPLAY PANEL AND MANUFACTURING METHOD OF DISPLAY PANEL

(75) Inventors: Tadahisa Tohyama, Akishima (JP); Tsuyoshi Ozaki, Fuchu (JP)

(73) Assignee: Casio Computer Co., Ltd., Tokyo (JP)

( * ) Notice: Subject to any disclaimer, the term of this patent is extended or adjusted under 35 U.S.C. 154(b) by 175 days.

(21) Appl. No.: 12/323,790

(22) Filed: Nov. 26, 2008

(65) Prior Publication Data

US 2009/0140648 A1 Jun. 4, 2009

(30) Foreign Application Priority Data

Nov. 29, 2007 (JP) ................................. 2007-308189

(51) Int. Cl.
*H01J 9/00* (2006.01)
*H01J 63/04* (2006.01)
(52) U.S. Cl. .......................................... 445/24; 313/505
(58) Field of Classification Search .......... 313/502–506; 445/23–25
See application file for complete search history.

(56) References Cited

U.S. PATENT DOCUMENTS

| | | | | |
|---|---|---|---|---|
| 2002/0063254 | A1* | 5/2002 | Tanaka et al. | 257/59 |
| 2004/0045576 | A1* | 3/2004 | Hobbs et al. | 134/1.1 |
| 2005/0142974 | A1 | 6/2005 | Lee | |
| 2007/0131926 | A1* | 6/2007 | Lee et al. | 257/40 |

FOREIGN PATENT DOCUMENTS

| | | |
|---|---|---|
| CN | 1638544 A | 7/2005 |
| CN | 1979912 A | 6/2007 |
| JP | 08-330600 A | 12/1996 |
| JP | 2004-259796 A | 9/2004 |
| JP | 2007-127752 A | 5/2007 |
| JP | 2007-165834 A | 6/2007 |
| KR | 2007-0096086 A | 10/2007 |

OTHER PUBLICATIONS

Chinese Office Action dated Apr. 2, 2010, issued in counterpart Chinese Application No. 200810178321.5, and English translation thereof.
Korean Office Action dated Jun. 28, 2010 and English translation thereof, issued in counterpart Korean Application No. 10-2008-0118875.
Japanese Office Action dated Oct. 13, 2009 and English translation thereof issued in counterpart Application No. 2007-308189.

* cited by examiner

*Primary Examiner* — Joseph L Williams
*Assistant Examiner* — Brenitra M Lee
(74) *Attorney, Agent, or Firm* — Holtz, Holtz, Goodman & Chick, PC

(57) ABSTRACT

A manufacturing method of a display panel including a light emitting element including a first electrode, a carrier transporting layer constituted of at least one layer and a second electrode so as to layer the first electrode, the carrier transporting layer and the second electrode, and the manufacturing method includes forming the first electrode in a predetermined region on a substrate, forming an opening from which only a predetermined region of the first electrode is exposed by patterning an insulation film by carrying out an etching after forming the insulation film on the substrate including the first electrode and forming the carrier transporting layer at least on the first electrode which is exposed from the opening.

13 Claims, 9 Drawing Sheets

IVA–IVA CROSS-SECTION

IVB–IVB CROSS-SECTION

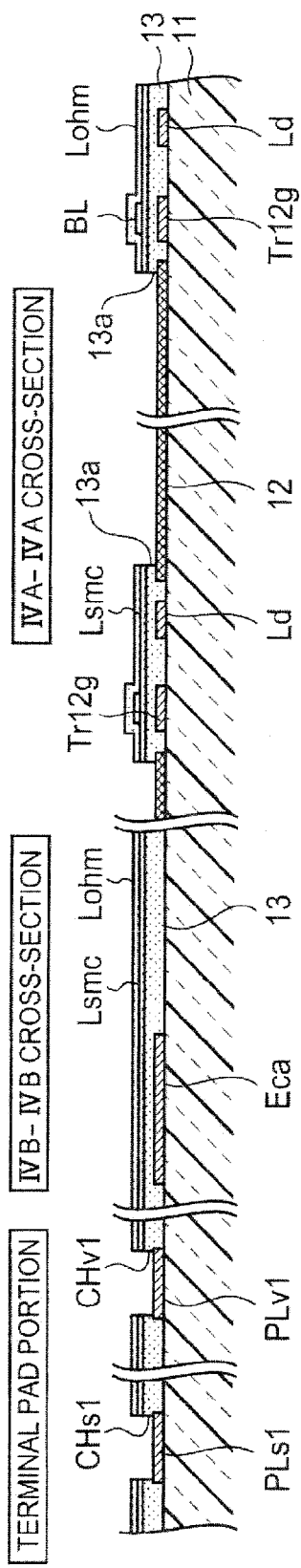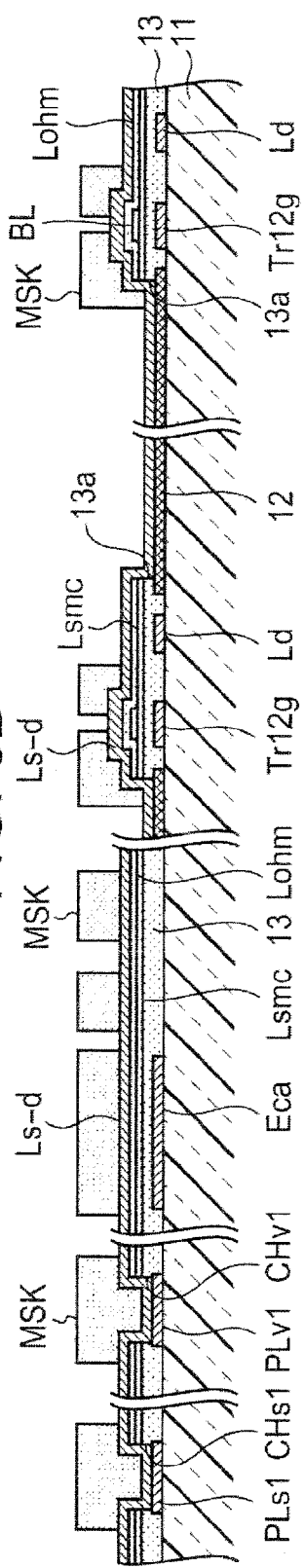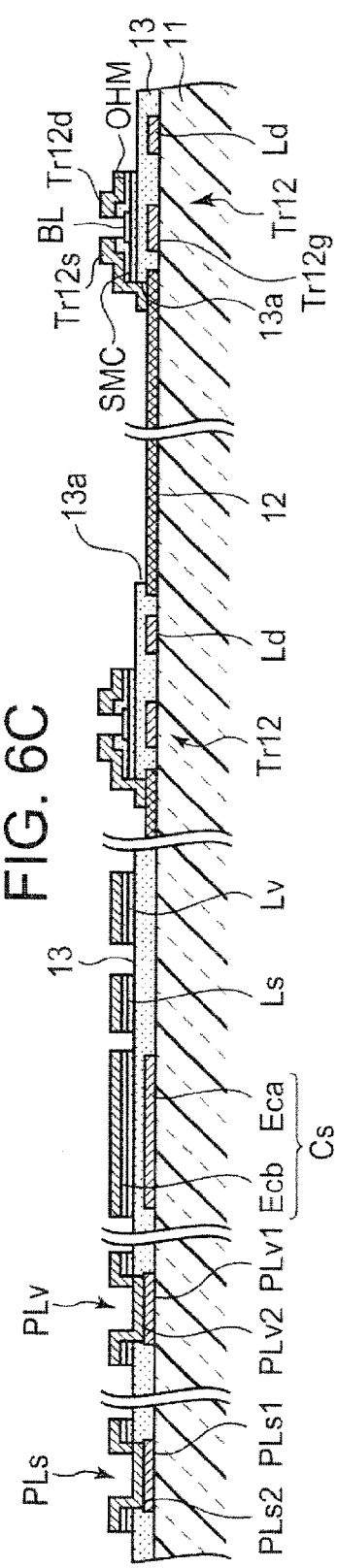

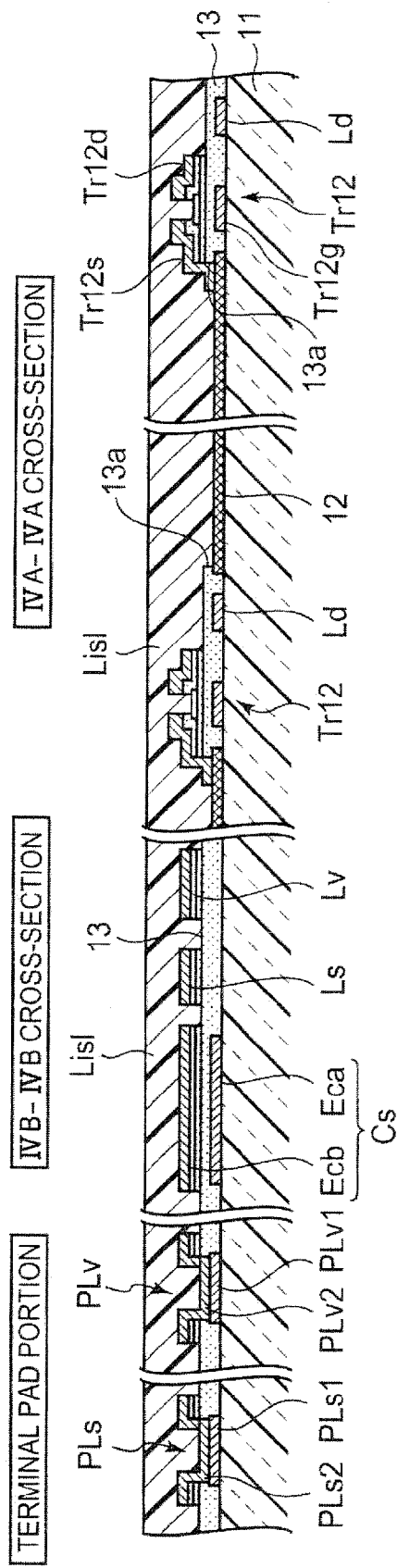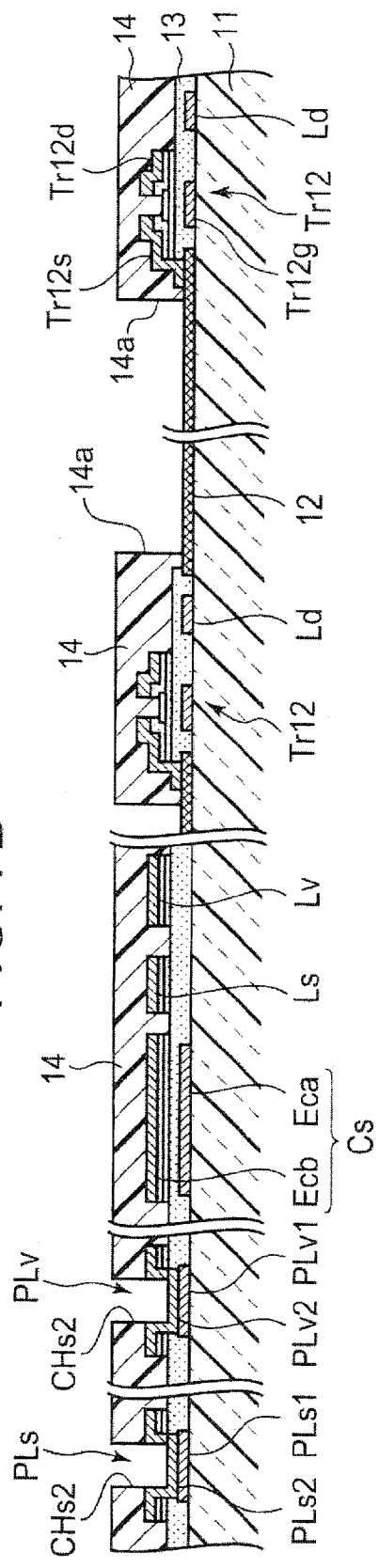

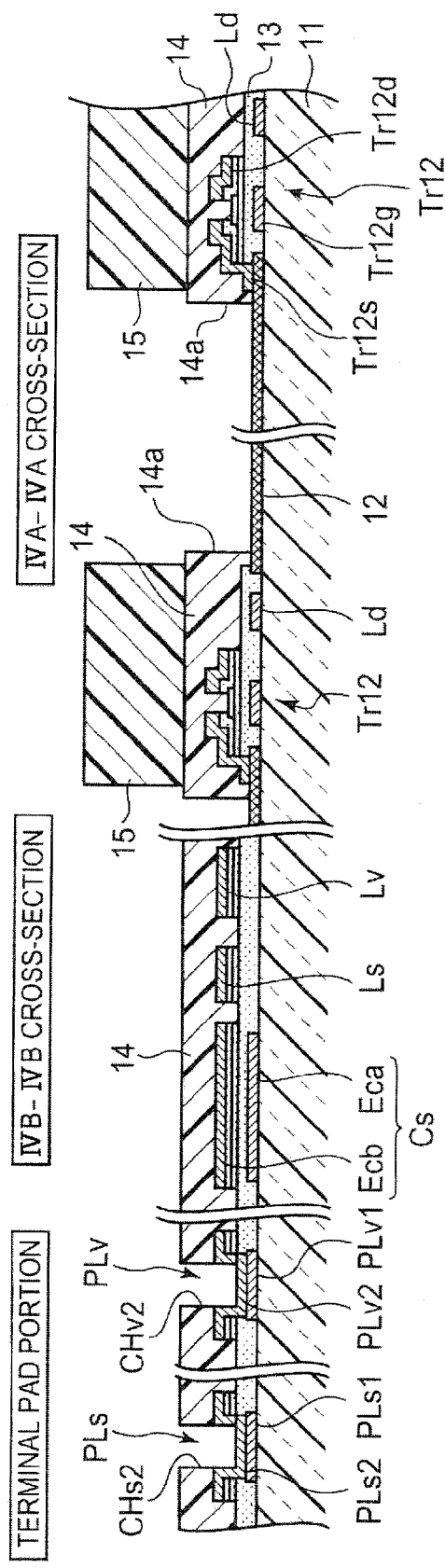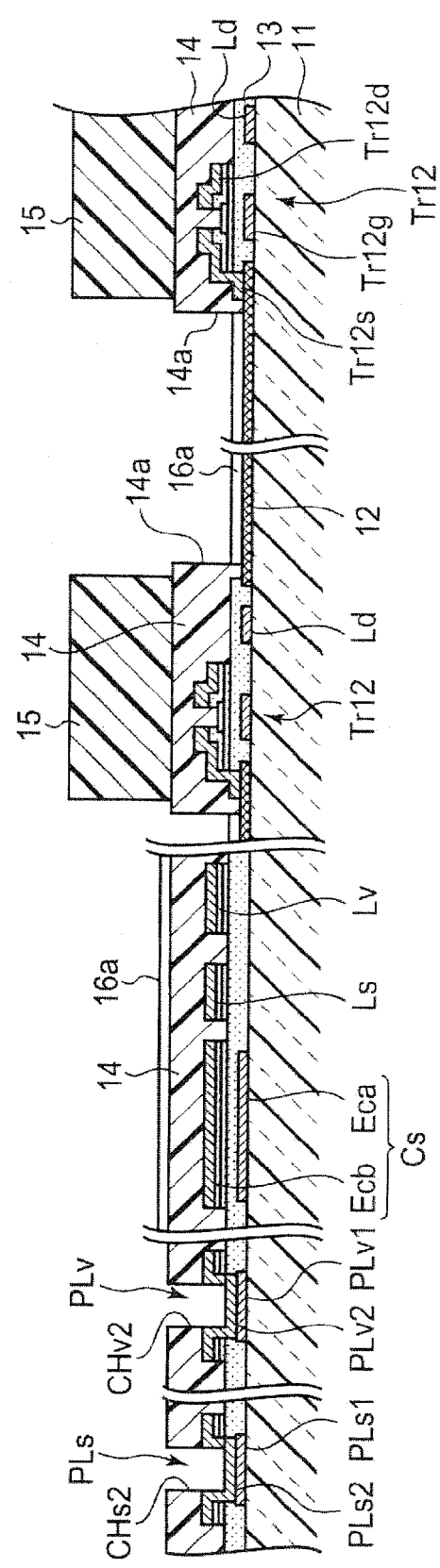

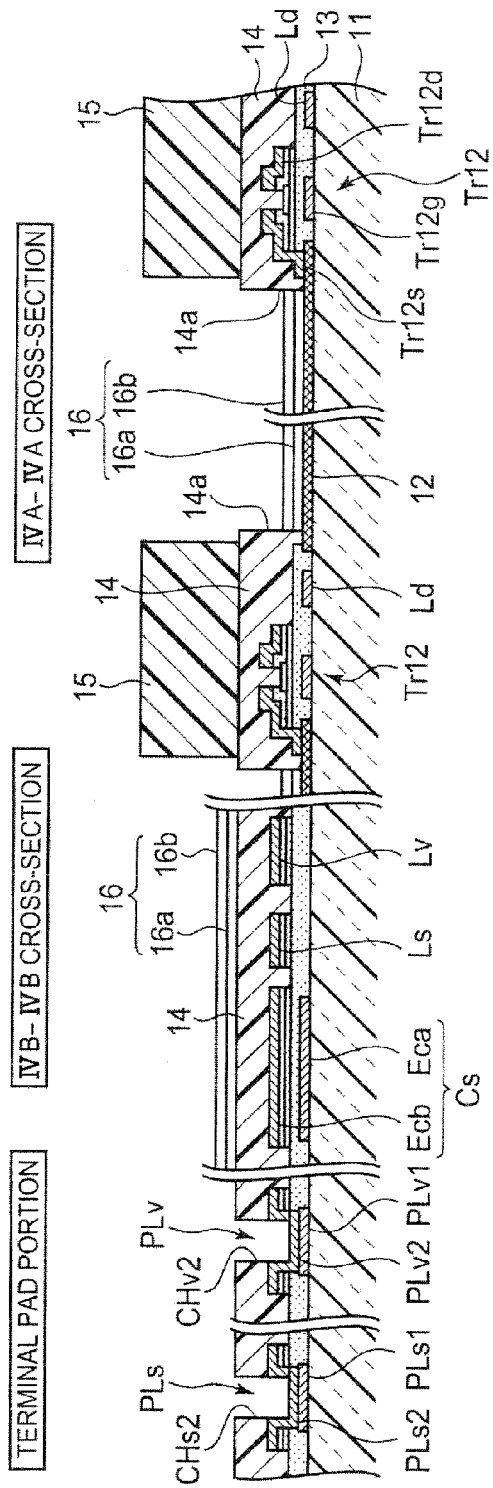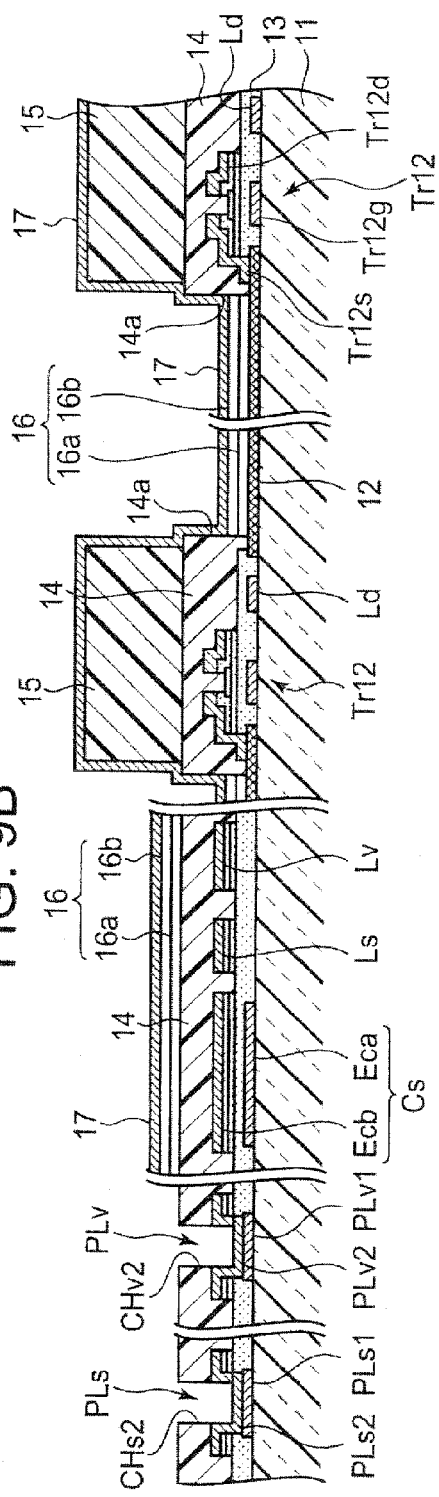
FIG. 9A
FIG. 9B

DISPLAY PANEL AND MANUFACTURING METHOD OF DISPLAY PANEL

BACKGROUND OF THE INVENTION

1. Field of the Invention

The present invention relates to a display panel and a manufacturing method thereof, particularly to a display panel comprising a display panel constituted by arranging a plurality of display elements which have light emitting element and a manufacturing method of the display panel.

2. Description of Related Art

In recent years, there is known a display device in which a display panel (organic EL display panel) having organic electroluminescence elements (hereinafter, abbreviated as "organic EL element") which are self light emitting elements two-dimensionally arranged is applied as the display device of electronic devices such as a cell phone, a portable music player and the like. Particularly, the organic EL display panel which applies the active-matrix drive method has good display properties such that display response speed is fast and view angle dependency is small comparing to the widely used liquid crystal display apparatus, and has a device structural feature that a backlight is not needed while it is needed in the liquid crystal display apparatus. Therefore, the organic EL display panel is anticipated to be used in various types of electronic devices in future.

As it is well known, in outline, the organic EL element has an element structure where the anode (positive electrode) electrode, the organic EL layer (light emitting layer) and the cathode (negative electrode) electrode are orderly layered on one surface side of a glass substrate or the like. Further, light (exciting light) is emitted from the organic EL element based on the energy generated when the injected hole and electron rejoin in the organic EL layer by the positive voltage being applied to the anode electrode and the negative voltage being applied to the cathode electrode within the organic EL layer so as to exceed the light emitting threshold.

Here, as for the display panel in which the organic EL elements (light emitting elements) are formed on one surface side of a glass substrate, there is known a bottom-emission type light emitting structure which emits light to the other surface side of the glass substrate by forming either one of the pair of electrodes (anode electrode, cathode electrode) formed so as to oppose to each other via the organic EL layer with an electrode material having light transparency and by forming the other of the pair of electrodes with an electrode material having light reflecting property.

In the above described manufacturing method, films such as the inter-layer insulation film and the like are accumulated at the region on the substrate where the transparent electrodes are to be formed and the films are removed before the transparent electrodes are formed, and thereafter, the transparent electrodes are formed. When the dry-etching is applied as the etching process of the film such as the inter-layer insulation film and the like which is executed before the process of forming the transparent electrodes on the substrate by using a gas mixture of oxygen and $SF_6$ or the like, thickness of the glass substrate will be uneven because the glass substrate in the region where the transparent electrodes are to be formed will also be etched. In such display panel in which the organic EL elements are formed on the substrate having uneven thickness, there is a problem that unevenness of scattering of light and interference of light occur due to the unevenness of thickness of the substrate and shifting of chromaticity and dispersion of light emitting brightness (emission intensity) occur when the light is emitted from the organic EL layer via the substrate in the light emitting operation, and the deterioration of display property such as running, blurring and the like of the image occurs.

SUMMARY OF THE INVENTION

In the present invention, in view of the above problem, an object is to provide a display panel having a good display property in which running and blurring do not occur in an image by suppressing the shifting of chromaticity, the dispersion of light emitting brightness (emission intensity) and to provide a manufacturing method of the display panel.

According to a first aspect of the present invention, a manufacturing method of a display panel comprising a light emitting element including a first electrode, a carrier transporting layer constituted of at least one layer and a second electrode so as to layer the first electrode, the carrier transporting layer and the second electrode, and the manufacturing method comprises forming the first electrode in a predetermined region on a substrate, forming an opening from which only a predetermined region of the first electrode is exposed by patterning an insulation film by carrying out an etching after forming the insulation film on the substrate including the first electrode and forming the carrier transporting layer at least on the first electrode which is exposed from the opening.

Preferably, the insulation film is patterned by an etching gas which erodes the substrate, and the insulation film is a silicon nitride or a silicon oxide.

Preferably, the etching gas is a gas mixture of oxygen and $SF_6$.

Preferably, the insulation film in which the opening is formed includes a gate insulation film of a transistor.

Preferably, the manufacturing method of the display panel further comprises forming either one of a source electrode or a drain electrode of the transistor after the first electrode is formed.

Preferably, the insulation film in which the opening is formed includes an inter-layer insulation film.

Preferably, the manufacturing method of the display panel further comprises forming a bank on the inter-layer insulation film by patterning a photosensitive resin layer.

Preferably, the manufacturing method of the display panel further comprises making a surface of the first electrode have a lyophilic characteristic to an organic compound containing solution by cleansing the substrate with pure water and by carrying out an oxygen plasma treatment or an UV ozone treatment after the bank is formed.

Preferably, the manufacturing method of the display panel further comprises making a surface of the bank have a repellency characteristic to the organic compound containing solution after the first electrode is made to have the lyophilic characteristic.

Preferably, the carrier transporting layer is formed by applying the organic compound containing solution in the forming of the carrier transporting layer after the surface of the bank is made to have the repellency characteristic.

Preferably, the manufacturing method of the display panel further comprises forming the second electrode on the carrier transporting layer after the carrier transporting layer is formed.

Preferably, the manufacturing method of the display panel further comprises forming a gate electrode of the transistor on the substrate by carrying out a wet-etching using an etchant of an acid system before the first electrode is formed.

According to a second aspect of the present invention, a manufacturing method of a display panel comprising a light emitting element including a first electrode, a carrier transporting layer constituted of at least one layer and a second electrode so as to layer the first electrode, the carrier transporting layer and the second electrode, and the manufacturing method comprises forming the first electrode in a predetermined region on a substrate, depositing an insulation film of a transistor and removing only the insulation film on the first electrode by an etching gas after the first electrode is formed, forming the carrier transporting layer on the first electrode and forming the second electrode on the carrier transporting layer.

According to a third aspect of the present invention, a display panel comprises a light emitting element including a first electrode, a carrier transporting layer constituted of at least one layer and a second electrode so as to layer the first electrode, the carrier transporting layer and the second electrode and a substrate having a predetermined region which is not exposed to an etching gas of an insulation film, and the first electrode is provided at the predetermined region of the substrate, the insulation film having an opening from which a predetermined region of the first electrode is exposed is formed on the substrate which includes the first electrode, the carrier transporting layer is formed at least on the first electrode which is exposed from the opening, and the second electrode is formed on a light emitting layer.

BRIEF DESCRIPTION OF THE DRAWINGS

The present invention will become more fully understood from the detailed description given hereinbelow and the appended drawings which are given by way of illustration only, and thus are not intended as a definition of the limits of the present invention, and wherein:

FIGS. 6A to 6C are process sectional diagrams showing an example of the display panel according to the embodiment (part 2);

FIGS. 7A to 7E are process sectional diagrams showing an example of the display panel according to the embodiment (part 3);

FIGS. 8A to 8B are process sectional diagrams showing an example of the display panel according to the embodiment (part 4); and FIGS. 9A to 9B are process sectional diagrams showing an example of the display panel according to the embodiment (part 5).

DESCRIPTION OF THE PREFERRED EMBODIMENTS

Hereinafter, a display panel and a manufacturing method of the display panel according to the present invention will be described in detail by showing an embodiment.

<Display Panel>

First, an embodiment of the display panel (organic EL display panel) and the display pixel according to the present invention will be described.

Figure 1:
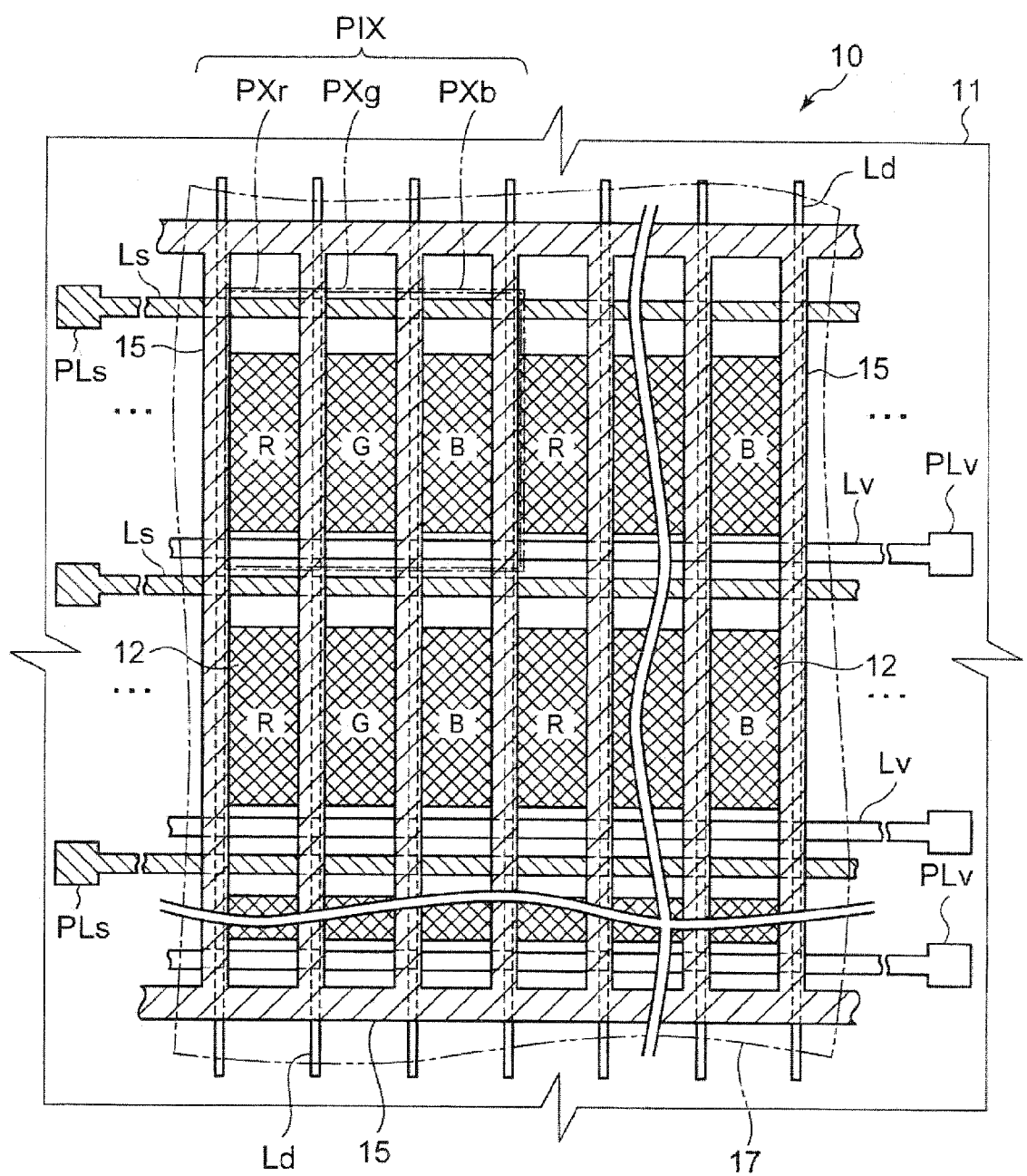
FIG. 1 is a schematic plan view showing an example of arrangement condition of pixels of a display panel according to the present invention.
Figure 2:
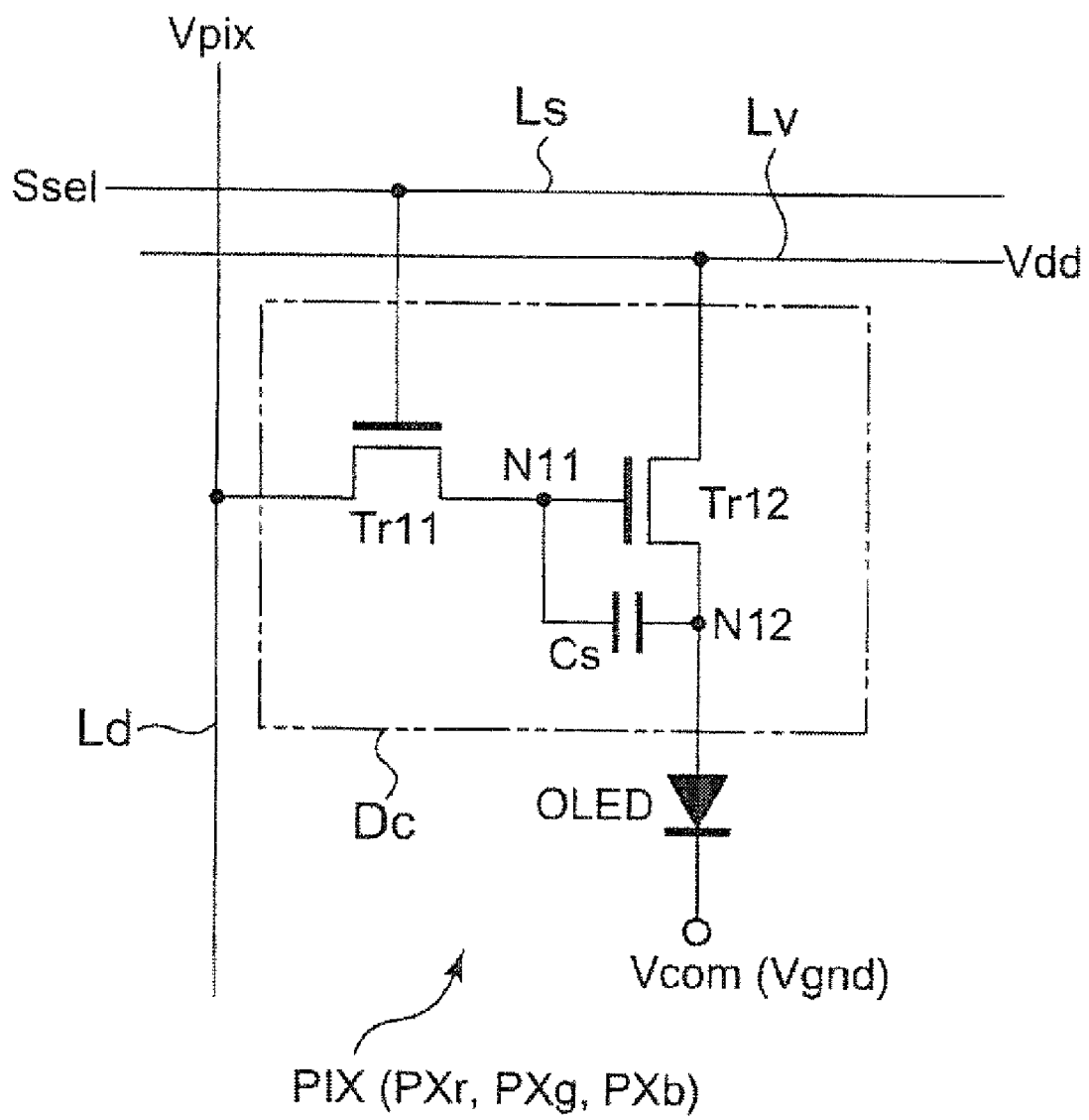
FIG. 2 is a diagram of an equivalent circuit showing an example of a circuit structure of display pixels (light emitting element and pixel drive circuit) which are two-dimensionally arranged in the display panel according to the present invention.

FIG. 1 is a schematic plan view showing an example of arrangement condition of pixels of the display panel according to the present invention, and FIG. 2 is a diagram of an equivalent circuit showing an example of a circuit structure of display pixels (light emitting element and pixel drive circuit) which are two-dimensionally arranged in the display panel of the present invention. Here, in the plan view shown in FIG. 1, only the relation between the disposition of pixel electrodes provided at each of the display pixels and the disposition structure of each siring layer and the disposition relation between the disposition of pixel electrodes provided at each of the display pixels and the bank (partition wall) which defines the forming region of each display pixel which are seen from one surface side (the side in which organic EL elements are formed) of the display panel are shown for convenience. The transistor and the like within the pixel drive circuit shown in FIG. 2 which are provided at each display pixel in order to drive the organic EL element of each of the display pixels so as to emit light are omitted from the drawing. Further, in FIG. 1, the pixel electrodes, each of the wiring layers are shown with hatchings for convenience in order to clearly show the disposition of the bank.

As shown in FIG. 1, the display panel 10 according to the embodiment comprises a plurality of select lines Ls disposed in a row direction (left-right direction in the drawing), a plurality of power voltage lines (for example, anode line) Lv disposed in the row direction so as to be parallel with the select lines Ls and a plurality of data lines Ld disposed in a line direction (top-down direction in the drawing) orthogonal to the select lines Ls and the power voltage lines Lv on one surface side (front side of the paper) of the insulative substrate 11 such as a glass substrate or the like. Further, each of the display pixels PIX (sub pixels PXr, PXg and PXb) are disposed in a region including each of the intersecting points of the select lines Ls and the data lines Ld. Moreover, a terminal pad PLs is provided at each of one of the ends of the select lines Ls and a terminal pad PLv is provided at each of one of the ends of the power voltage lines Lv.

Here, when the above display panel 10 corresponds to color display, for example, the sub pixels (hereinafter, described as "color pixel" for convenience) PXr, PXg and PXb of each of three colors of red (R), green (G) and blue (B) are repeatedly arranged in the row direction (left-right direction in the drawing) and further a plurality of each of the color pixels PXr, PXg and PXb of the same color are arranged in the line direction (top-down direction in the drawing) as shown in FIG. 1. In such case, one display pixel PIX is formed by having the color pixels PXr, PXg and PXb of three colors of RGB which are adjacent in the row direction (left-right direction in the drawing) as one group. When the display panel (monocolor display panel) only has the color pixels which emits single color, each color pixel is one display pixel PXI.

Figure 3:
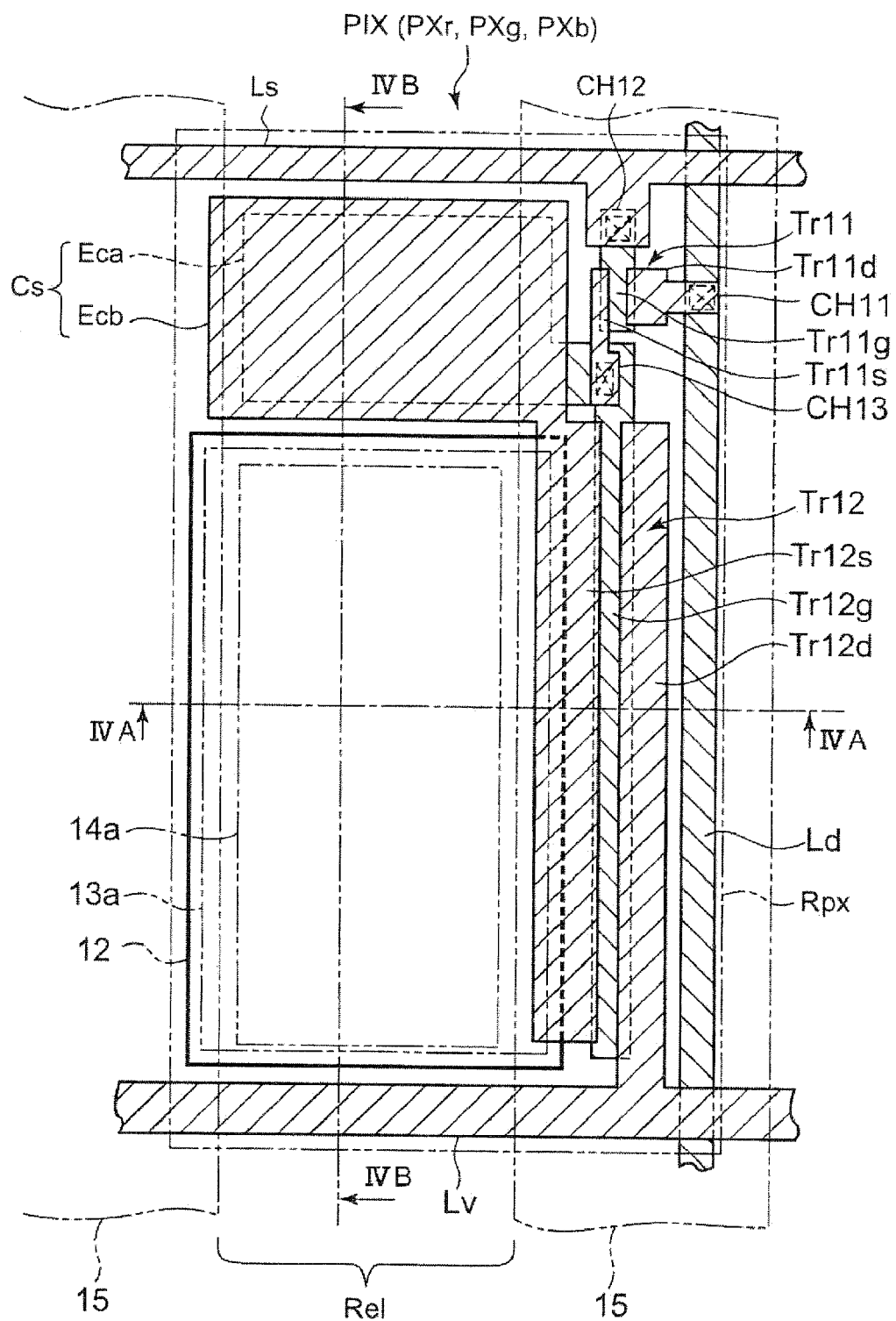
FIG. 3 is a plan layout diagram showing an example of a display pixel which can be used in the display panel according to the present invention.

Moreover, in the display panel 10 corresponding to color display, when the organic EL layer is formed by applying or evaporating a solution including a polymeric organic material or a low-molecular organic material as shown in the after mentioned manufacturing method, for example, a bank (partition wall) 15 formed with an insulating material is protruded from one surface side of the substrate 11 and is disposed so as to enclose each of the organic EL layer forming regions for each display pixel (color pixel) PIX in a plan palisaded shape or in a plan lattice shape as shown in FIG. 1. Thereby, the forming region (EL element forming region Rel shown in FIG. 3) of the organic EL element OLED within the pixel forming region Rpx shown in FIG. 3 is defined. Here, when the bank 15 is in a plan palisaded shape as shown in FIG. 1, the pixel electrode (for example, anode electrode) 12 of a plurality of color pixels PXr, PXg or PXb of same color which are arranged in the line direction (top-down direction in the drawing) is included in one EL element forming region Rel.

For example, as shown in FIG. 2, the display pixel PIX (each of color pixels PXr, PXg and PXb) may apply a circuit structure comprising a pixel drive circuit DC having a plurality of transistors (for example, amorphous silicon thin film transistor or the like) on the substrate 11 and an organic EL element (light emitting element) OLED which operates so as to emit light by the light emitting drive current generated by the pixel drive circuit DC being supplied to the pixel electrode 12.

In particular, for example, the pixel drive circuit DC comprises a transistor (select transistor) Tr11 in which the gate terminal is connected to the select line Ls, the drain terminal is connected to the data line Ld and the source terminal is connected to the connection point N11, respectively, the transistor (drive transistor; functional element) Tr12 in which the gate terminal is connected to the connection point N11, the drain terminal is connected to the power voltage line Lv and the source terminal is connected to the connection point N12, respectively, and the capacitor Cs which is connected between the gate terminal and the source terminal of the transistor Tr12 as shown in FIG. 2.

Here, the n-channel type field effect transistor (thin film transistor) having a thin film structure is used for both of the transistors Tr11 and Tr12. The transistors Tr11 and Tr12 may be amorphous silicon thin film transistors or polysilicon thin film transistors. Regarding the transistors Tr11 and Tr12, the electrical relation of the source terminal and the drain terminal will be the opposite of one another from what is described above when at least either one of the transistors Tr 11 and Tr12 is the p-channel type.

Moreover, the capacitor Cs is a capacitance component constituted with a parasitic capacitance formed between the gate terminal and the source terminal of the transistor Tr12 or a supportive capacitance additionally provided between the gate terminal and the source terminal of the transistor Tr12, or the capacitor Cs is a capacitance component constituted with both the parasitic capacitance and the supportive capacitance. Therefore, when the transistor Tr12 is the p-channel type, one end of the capacitor Cs will be connected to the side of power voltage line Lv instead of the side of organic EL element OLED (connection point N12 side).

In the organic EL element OLED, the anode terminal (the pixel electrode 12 which is an anode electrode) is connected to the connection point N12 of the above pixel drive circuit DC and the cathode terminal (cathode electrode) is integrally formed with the counter electrode (common electrode) 17 and is directly or indirectly connected to a predetermined standard voltage Vcom (for example, ground voltage Vgnd). Here, the counter electrode 17 is formed with a single electrode layer (solid electrode) so as to commonly oppose to the pixel electrode 12 of a plurality of display pixels PIX which are two-dimensionally arranged on the substrate 11. Thereby, the above standard voltage Vcom is commonly applied to a plurality of display pixels PIX.

Here, in the display pixel PIX (pixel drive circuit DC and organic EL element OLED) shown in FIG. 2, the select line Ls is connected to the select driver provided at the periphery of the display region (omitted from the drawing) of the substrate 11 via the terminal pad PLs shown in FIG. 1, and the select signal Ssel for setting the plurality of display pixels PIX (color pixels PXr, PXg and PXb) which are arranged in the row direction of the display panel 10 to be in a select state at a predetermined timing is applied. Further, the data line Ld is connected to the data driver which is provided at the periphery of the display region (omitted from the drawing) of the substrate 11, and the tone signal Vpix according to the display data is applied at a timing synchronizing to the select state of the above display pixel PIX. Here, the tone signal Vpix is a voltage signal to set the light emitting brightness tone of the organic EL element OLED.

Moreover, the power voltage line Lv is directly or indirectly connected to a predetermined high voltage power, for example, via the terminal pad Plv shown in FIG. 1, and a predetermined high voltage (power voltage Vdd) having a higher voltage than the standard voltage Vcom which is applied to the counter electrode 17 of the organic EL element OLED is applied to make the light emitting drive current according to the display data flow to the pixel electrode 12 of the organic EL element OLED provided at each of the display pixels PIX.

That is, in the pixel drive circuit DC shown in FIG. 2, each of the power voltage Vdd and the standard voltage Vcom are applied to both ends (drain terminal of transistor Tr12 and cathode terminal of organic EL element OLED) of a pair of the transistor Tr12 and the organic EL element OLED which are serially connected in each display pixel PIX to give the forward bias to the organic EL element OLED and makes the organic EL element OLED be in a light emittable state, and further controls the current value of the light emitting drive current which flows to the organic EL element OLED according to the tone signal Vpix.

Then, in the driving control operation of the display pixel PIX having the above described circuit structure, first, the transistor Tr11 is operated so as to be on to be set in the select state by applying the select signal Ssel of the select level (on level; for example, high level) to the select line Ls from the select driver (omitted from the drawing) during a predetermined select period. By synchronizing with this timing, the tone signal Vpix having the voltage value according to the display data is controlled to be applied to the data line Ld from the data driver (omitted from the drawing). Thereby, the electric potential according to the tone signal Vpix is applied to the connection point N11 (that is, gate terminal of transistor Tr12) via the transistor Tr11.

In the pixel drive circuit DC having the circuit structure shown in FIG. 2, the current value of the current (that is, light emitting drive current which flows into organic EL element OLED) between the drain terminal and the source terminal of the transistor Tr12 is determined by the electric potential difference between the drain terminal and the source terminal and the electric potential difference between the gate terminal and the source terminal. Here, the power voltage vdd to be applied to the drain terminal (drain electrode) of the transistor Tr12 and the standard voltage Vcom to be applied to the cathode terminal (cathode electrode) of the organic EL element OLED are fixed values. Therefore, the electric potential difference between the drain terminal and the source terminal of the transistor Tr12 is fixed in advance by the power voltage Vdd and the standard voltage Vcom. Further, the electric potential difference between the gate terminal and the source terminal of the transistor Tr12 is primarily determined by the electric potential of the tone signal Vpix. Therefore, the current value of the current which flows between the drain terminal and the source terminal of the transistor Tr12 can be controlled by the tone signal Vpix.

In such way, the transistor Tr12 is operated so as to be on in the conduction state (that is, conduction state according to the tone signal Vpix) according to the electric potential of the connection point N11, and the light emitting drive current having a predetermined current value flows into the standard voltage Vcom (ground potential Vgnd) in the low potential side from the power voltage Vdd in the high potential side via the transistor Tr12 and the organic EL element OLED. Therefore, the organic EL element OLED operates so as to emit light at the brightness tone according to the tone signal Vpix (that is, display data). Further, at this time, load is accumulated (charged) in the capacitor Cs between the gate terminal and the source terminal of the transistor Tr12 based on the tone signal Vpix applied to the connection point N11.

Subsequently, in the non-select period after the above select period is finished, the transistor Tr11 of the display pixel PIX operates so as to be turned off and to be set in the non-select condition by the select signal Ssel of the non-select level (off level; for example, low level) being applied to the select line Ls, and the data line Ld and the pixel drive circuit DC (in particular, connection point N11) are electrically cut off. At this time, the voltage corresponding to the tone signal Vpix is retained in the gate terminal of the transistor Tr12 (that is, electric potential difference between gate terminal and source terminal is retained) by the accumulated load being retained in the above capacitor Cs.

Therefore, similarly in the light emitting operation in the above described select condition, a predetermined light emitting drive current flows to the organic EL element OLED from the power voltage Vdd via the transistor Tr12, and the light emitting operation condition is continued. This light emitting operation condition is controlled so as to be continued during 1 frame period, for example, until the next tone signal Vpix is applied (written). Further, the image display operation to display the desired image information can be executed by orderly executing the above described drive control operation for each line, for example, for all of the display pixels PIX (each color pixel PXr, PXg and PXb) which are two-dimensionally arranged in the display panel 10.

Here, in FIG. 2, a circuit structure which corresponds to the tone control system of a voltage assigned type which makes the organic EL element OLED operate so as to emit light at a desired brightness tone by controlling the current value of the light emitting drive current to be flown into the organic EL element OLED by adjusting (specifying) the voltage value of the tone signal Vpix to be written in each of the display pixels PIX (in particular, gate terminal of transistor Tr12 of pixel drive circuit DC; connection point N11) according to the display data is shown as the pixel drive circuit DC provided in the display pixel PIX. However, the pixel circuit DC may have a circuit structure of the tone control system of a current assigned type which makes the organic EL element OLED operate so as to emit light at a desired brightness tone by controlling the current value of the light emitting drive current to be flown into the organic EL element OLED by adjusting (specifying) the current value of the current to be supplied (to be written) to each of the display pixels PIX according to the display data may be applied.

Moreover, in the pixel drive circuit DC shown in FIG. 2, a circuit structure in which two n-channel type transistors Tr11 and Tr12 are used is shown. However, the display panel according to the present invention is not limited to this. A display panel having other circuit structure in which three or more transistors, a display panel only using the p-channel type transistor as the circuit element or a display panel in which transistors having channel polarity of both n-channel type and p-channel type are mixed may be applied. Here, as shown in FIG. 2, when only the n-channel type transistor is used as the pixel drive circuit DC, a transistor having a stable operation property can be easily manufactured by using the manufacturing technique of amorphous silicon semiconductor which is already established, and the pixel drive circuit in which dispersion in the light emitting property of the display pixels is suppressed can be realized.

<Device Structure of Display Pixel>

Next, the particular device structure (plan layout and sectional structure) of the display pixel (pixel drive circuit and organic EL element) having above described circuit structure will be described.

Figure 4A:
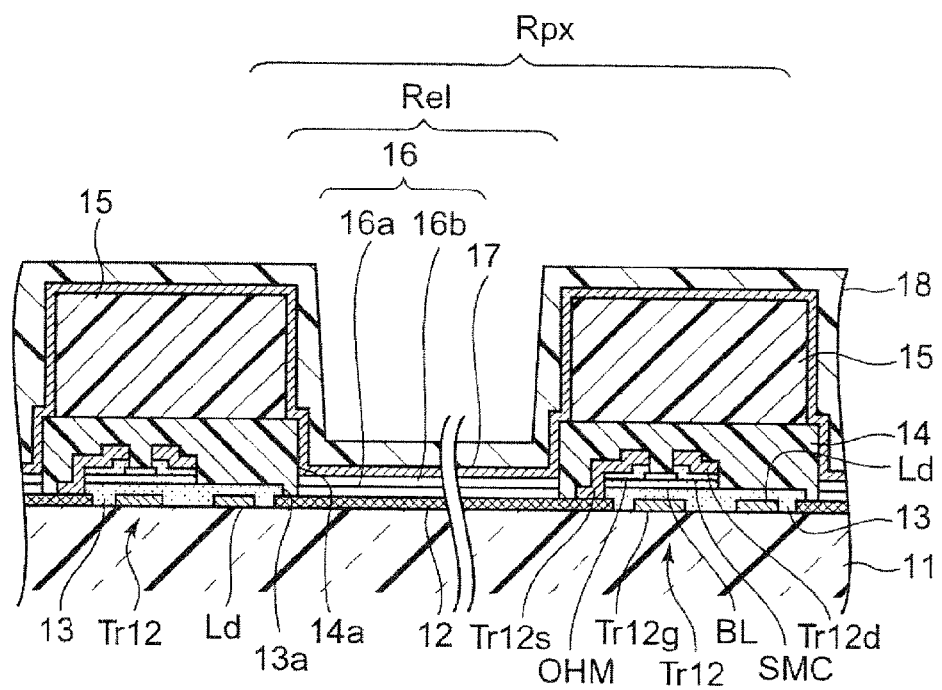
FIGS. 4A and 4B are schematic sectional diagrams of the display pixel having a plan layout according to the embodiment.
Figure 4B:
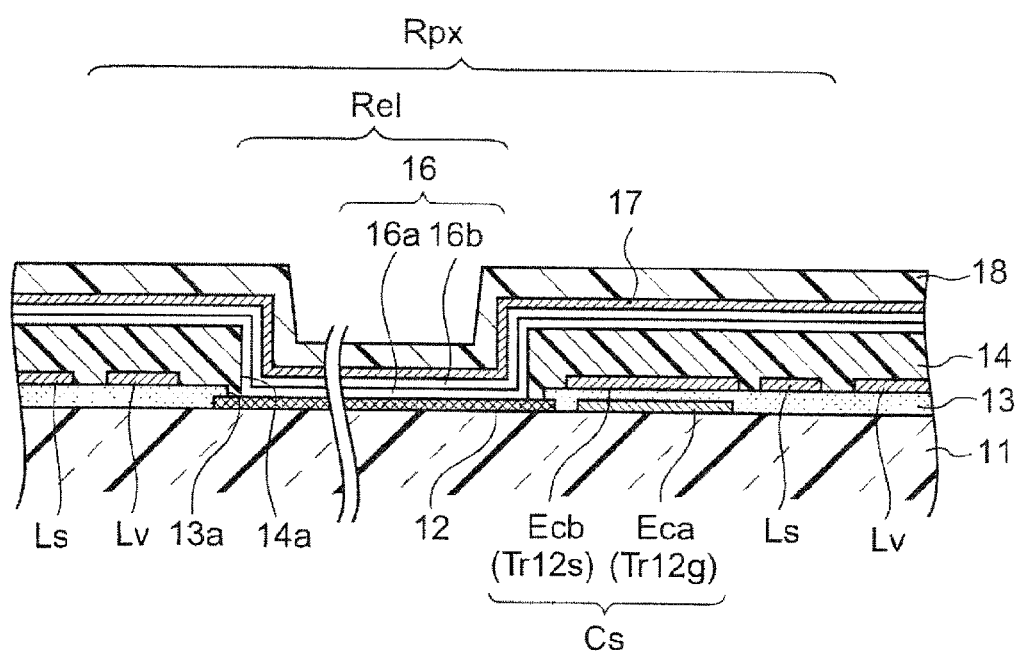

FIG. 3 is a plan layout diagram showing an example of a display pixel which is usable in the display panel according to the present invention. Here, a plan layout of one specific color pixel among the color pixels PXr, PXg and PXb of the display pixels PIX of red (R), green (G) and blue (B) shown in FIG. 1 is shown. Here, in FIG. 3, the layer in which each of the transistors of the pixel drive circuit DC, the wiring layer and the like are formed is mainly shown, and the hatching is conveniently carried out in order to clearly show the dispositions and the planar shape of each of the wiring layers and each of the electrodes. Further, FIGS. 4A and 4B are schematic sectional diagrams showing the cross section cut along the line IVA-IVA (In the specification, "IV" is conveniently used as a symbol corresponding to roman numeral "4" shown in FIG. 3.) and the cross section cut along the line IVB-IVB in the display pixel having a plan layout shown in FIG. 3.

In particular, for example, in the display pixel (color pixel) PIX shown in FIG. 2, the select line Ls and the power voltage line Lv are respectively disposed so as to extend in the row direction (left-right direction in the drawing) in the marginal region at upper side and lower side of the drawing and the data line Ld is disposed so as to extend in the line direction (top-down direction in the drawing) in the marginal region at the right side of the drawing so that the data line Ld orthogonally cross with the Lines Ls and Lv in the pixel forming region Rpx which is defined in one surface side of the substrate 11 as shown in FIG. 3. Further, the bank 15 is disposed at the marginal region at right side and left side of the plan layout so as to extend in the line direction (top-down direction in the drawing) across the display pixels PIX which are adjacent in right side and left side.

Here, for example, the data line Ld is provided more in the lower layer side (substrate 11 side) than the select line Ls and the power voltage line Lv, and the data line Ld is formed in the same process as the process to form the gate electrodes Tr11g and Tr12g by patterning the gate metal layer for forming the gate electrodes Tr11g and Tr12g of the transistors Tr11 and Tr12 as shown in FIGS. 3 and 4. Further, the data line Ld is connected to the drain electrode Tr11d of the transistor Tr11 via the contact hole CH11 provided at the gate insulation film 13 which is constituted with nitride silicon or oxide silicon and which is formed so as to cover the data line Ld.

For example, a metal layer of aluminum (Al), titanium (Ti), vanadium (V), chromium (Cr), manganese (Mn), iron (Fe), cobalt (Co), nickel (Ni), copper (Cu), zinc (Zn), zirconium (Zr), niobium (Nb), molybdenum (Mo), palladium (Pd), silver (Ag), indium (In), tin (Sn), tantalum (Ta), tungsten (W), platinum (Pt) or gold (Au) in a simple form or compound or alloy including the above can be preferably used as the gate metal layer.

The select line Ls and the power voltage line Lv are provided more in the upper layer side than the data line Ld and the gate electrodes Tr11g and Tr12g, and the select line Ls and the power voltage line Lv are formed in the same process as the process to form the source electrodes Tr11s, Tr12s and the drain electrodes Tr11d, Tr12d by patterning the source/drain metal layer for forming the source electrodes Tr11s, Tr12s and the drain electrodes Tr11d, Tr12d of the transistors Tr11, Tr12.

The select line Ls is connected to the gate electrode Tr11g via the contact hole CH12 provided at the gate insulation film 13 which positions at one end side of the gate electrode Tr11g of the transistor Tr11. Further, the power voltage line Lv is integrally formed with the drain electrode Tr12d of the transistor Tr12.

Here, similarly to the above described gate metal layer, a metal layer of aluminum (Al), titanium (Ti), vanadium (V), chromium (Cr), manganese (Mn), iron (Fe), cobalt (Co), nickel (Ni), copper (Cu), zinc (Zn), zirconium (Zr), niobium (Nb), molybdenum (Mo), palladium (Pd), silver (Ag), indium (In), tin (Sn), tantalum (Ta), tungsten (W), platinum (Pt) or gold (Au) in a simple form or compound or alloy including the above can be preferably used for the source/drain metal layer for forming the select line Ls and the power voltage line Lv. As for a particular example, the source/drain metal layer may be formed with aluminum allow such as simple aluminum (Al), aluminum-titanium (AlTi), aluminum-neodymium-titanium (AlNdTi) or a single layer or an alloy layer of low resistance metal for reducing the wiring resistance such as copper (Cu), or the source/drain metal layer may have a laminate structure in which the transition metal layer for reducing migration such as chromium (Cr), titanium (Ti) and the like is provided at the lower layer of the low resistant metal layer. In particular, a two layer structure of AlTi/Cr or a two layer structure of AlNdTi/Cr is preferable. Here, when the gate metal layer and the source/drain metal layer are formed by same forming apparatus such as a spattering, the gate metal layer may have the material constitution and the layer structure same as the source/drain metal layer.

Further, more in particular, in the pixel drive circuit DC, the transistor Tr11 and Tr12 shown in FIG. 2 are disposed so as to extend along the line direction, for example, as shown in FIG. 3. Here, each of the transistors Tr11 and Tr12 has a well known thin film transistor structure of field effective type. Further, for example, each of the transistors Tr11 and Tr12 has a reversed stagger structure comprising the gate electrodes Tr11g, Tr12g formed on the substrate 11, the semiconductor layer SMC formed in the region corresponding to each of the gate electrodes Tr11g, Tr12g via the gate insulation film 13 formed on the gate electrodes Tr11g, Tr12g so as to cover them and the source electrodes Tr11s, Tr12s and the drain electrodes Tr11d, Tr12d formed so as to extend to both side portions of the channel of the semiconductor layer SMC.

On the channel of the semiconductor layer SMC in which the source electrode Tr11s, Tr12s and the drain electrode Tr11d and TR12d of each of the transistors Tr11, Tr12 are disposed at both end portions so as to oppose to one another, a channel protection layer (block layer) BL constituted with oxide silicon, nitride silicon or the like for preventing the etching damage to the semiconductor layer SMC in the manufacturing process is formed. Further, on both end portions of the channel of the semiconductor layer SMC in which the source electrodes Tr11s, Tr12s and the drain electrodes Tr11d, Tr12d contact, an impurity layer OHM for realizing the ohmic connection between the semiconductor layer SMC and the source electrodes Tr11s, Tr12s and between the semiconductor layer SMC and the drain electrodes Tr11d, Tr12d is formed.

Moreover, so as to correspond to the circuit structure of the pixel drive circuit DC shown in FIG. 2, in the transistor Tr11, the gate electrode Tr11g is connected to the select line Ls via the contact hole CH12 provided at the gate insulation film 13 and the drain electrode Tr11d is connected to the data line Ld via the contact hole CH11 provided at the gate insulation film 13 as shown in FIG. 3.

In the transistor Tr12, the gate electrode Tr12g is connected to the source electrode Tr11s of the transistor Tr11 via the contact hole CH13 provided at the gate insulation film 13, and the drain electrode Tr12d is integrally formed with the power voltage line Lv and the source electrode Tr12s is directly connected to the pixel electrode 12 of the organic EL element OLED provided on the substrate 11 as shown in FIGS. 3 and 4A.

Moreover, in the capacitor Cs, the electrode Eca integrally formed with the gate electrode Tr12g of the transistor Tr12 on the substrate 11 and the electrode Ecb integrally formed with the source electrode Tr12s of the transistor Tr12 on the gate insulation film 13 are provided so as to oppose to one another by having the gate insulation film 13 in between as shown in FIGS. 3 and 4B.

As shown in FIGS. 3 and 4, the organic EL element OLED is directly provided on the substrate 11 which is the same layer at the gate electrodes Tr11g, Tr12g of the transistors Tr11 and Tr12 and is directly connected to the source electrode Tr12s of the transistor Tr12, and the organic EL element OLED is formed by orderly layering the pixel electrode (for example, anode electrode) 12 having light transparency characteristic in which a predetermined light emitting drive current is supplied, the inter-layer insulation film 14 formed in the region (bordering region) between the adjacent pixel electrodes 12 of the display pixel PIX by covering the gate insulation film 13, the transistors Tr11 and Tr12, the canapocor Cs and each of the lines Ls, Lv and Ld, the organic EL layer (carrier transporting layer) 16 having the hole transporting layer 16a which is a carrier transporting layer having hole transporting property and the electron transporting light emitting layer 16b which is a carrier transporting layer having electron transporting property and that emits light, for example, which is formed in the EL element forming region Rel (a region enclosed by the bank 15) defined by the bank 15 disposed on the inter-layer insulation film 14 so as to be continuously protruded and the counter electrode (for example, cathode electrode) 17 constituted with a single electrode layer (solid layer) having light reflecting characteristic which is provided so as to commonly oppose to the pixel electrodes 12 of each of display pixels PIX which are two-dimensionally arranged on the substrate 11.

Each of transistors Tr11, Tr12 of the display pixels PIX are thin film transistors of a reversed stagger structure, and the gate insulation film 13 is not formed in the region exposed from the opening encircled by the end portion 14a of the after-mentioned inter-layer insulation film 14 within the pixel electrode 12 so that the gate insulation film 13 does not overlap with the EL element forming region Rel.

For instance, when the pixel electrode 12 and the gate insulation film 13 are disposed so as to overlap with one another at the lower surface of the organic EL layer 16 differently from the above described structure, the light emitted from the organic EL layer 16 reflects at the interface between the pixel electrode 12 and the gate insulation film 13 according to the angle of incidence of the light when there is a refraction factor difference between the pixel electrode 12 and the gate insulation film 13, and this reflection causes a multiple reflection.

When the ITO having a refraction factor of about 2.1 is used for the pixel electrode 12, nitride silicon having a refraction factor of about 2.0 is used for the gate insulation film 13 and glass having a refraction factor about 1.5 is used for the substrate 11, a difference of about 0.03 occurs in the xyztrichromatic coordination system between when the film thickness of the gate insulation film 13 is 200 nm and when it is 190 nm. As described above, when a gate insulation film is disposed at the light path at lower part of the pixel electrode 12 in addition to the substrate, visually different color will be emitted from the substrate even when the difference in film thickness of the gate insulation film is about ±5%.

In the above embodiment, the gate insulation film 13 in which the unevenness is relatively easy to occur is not disposed at the light path between the pixel electrode 12 and the substrate 11. Therefore, the light emitted from the organic EL layer 16 passes through the pixel electrode 12 and is emitted via the substrate 11 without receiving dispersion or interference of light by the gate insulation film 13. Therefore, shifting of chromaticity of the emitted light can be suppressed.

Here, the counter electrode 17 is provided so as to extend onto the bank 15 which defines the EL element forming region Rel and not only each of the EL element forming regions Rel. Further, at the periphery of the EL element forming region Rel, because the bank 15 is formed at the bordering region with the EL element forming region Rel of the display pixels PIX adjacent in the right-left direction of the plan layout shown in FIG. 3 is formed, a part of select line Ls and the power voltage line Lv, the data line Ld and the transistors Tr11, Tr12 overlap with the bank 15 in a planar manner (in a plan view).

Here, the device structure of the display pixels according to the embodiment is not limited to the structure shown in FIGS. 3, 4A and 4B. The select line Ls and the power voltage line Lv may be formed at the lower layer of the gate insulation film 13 by patterning the gate metal layer, and the select line Ls may be integrally provided with the gate electrode Tr11g or the data line Ld may be integrally provided with the drain electrode Tr11d without providing the contact holes CH11 and CH12 by forming the data line Ld at the upper layer of the gate insulation film 13 by patterning the source/drain metal layer.

As shown in FIG. 1, the bank 15 is disposed so as to have a planar pattern of palisaded shape enclosing a plurality of pixel electrodes 12 of the color pixels PXr, PXg and PXb of same colors (or in a lattice shape enclosing a plurality of pixel electrodes 12 of the color pixels PXr, PXg and PXb) in the bordering region of a plurality of display pixels PIX which are two-dimensionally arranged in the display panel 10, in particular, in the region between each of the pixel electrodes 12 of the color pixel PXr, PXg and PXb which are repeatedly arranged in the row direction of the display panel which is in the line direction of the display panel 10.

Here, as shown in FIGS. 3, 4A and 4B, the transistors Tr11, Tr12 are formed so as to extend in the line direction of the bordering region, and the bank 15 is formed so as to be continuously protruded in the height direction from the surface of the substrate 11 on the inter-layer insulation film 14 formed between the pixel electrodes 12 of each of the pixel forming regions Rpx by covering the transistors Tr11, Tr12. Thereby, the region enclosed by the bank 15, that is the region including the pixel electrodes 12 of a plurality of display pixels PIX which are arranged in the line direction is defined as the applying region (that is, EL element forming region Rel) of a solution including organic compound material or a solvent of suspension liquid (organic compound containing solution) at the time of forming the organic EL layer 16 (for example, hole transporting layer 16a and electron transporting light emitting layer 16b) in the after-mentioned manufacturing method.

Moreover, for example, the bank 15 is formed by using a photosensitive resin material, a surface treatment is carried out to the bank 15 so that at least the surface (side surfaces and upper surface) thereof have repellency characteristic to the organic compound containing solution which is to be applied to the EL element forming region Rel at the time of forming the organic EL layer 16.

Further, for example, as shown in FIG. 4, a sealing layer 18 having a function as a protection insulation film (passivation film) is formed on the entire surface of the substrate 11 on which the pixel drive circuit DC, the organic EL element OLED and the bank 15 are formed so as to cover them. Furthermore, the sealing layer 18 may be formed by joining a sealing substrate constituted with a glass substrate or the like (omitted from the drawing) so as to oppose to the substrate 11.

In such way, in the display panel according to the embodiment, the pixel electrodes 12 constituted of transparent electrode material such as ITO or the like connected to the output terminal (source electrode Tr12s of transistor Tr12) of the pixel drive circuit DC which controls the light emitting operation of the organic EL element OLED is directly provided on the substrate 11 without having the gate insulation film 13 in between. Particularly, the pixel electrode 12 is provided on the same layer (the layer which directly contacts with substrate 11) as the gate electrodes Tr11g, Tr12g forming the transistors Tr11, Tr12 of the pixel drive circuit DC, and the pixel electrode 12 is formed by a process which is different from the process for forming the gate electrodes Tr11g, Tr12g.

Further, in such display panel 10 (display pixel PIX), the light emitting drive current having a predetermined current value flows between the drain terminal and the source terminal of the transistor Tr12 based on the tone signal Vpix according to the display data supplied via the data line Ld, and the organic EL element OLED of each of the display pixels (color pixels) PIX operate so as to emit light in a desired brightness tone according to the display data by the light emitting drive current being supplied to the pixel electrodes 12 of the organic EL element OLED.

Here, in the display panel 10 according to the embodiment, the pixel electrode 12 has light transparency characteristic (having high transmissivity to visible light) and the counter electrode 17 has light reflecting characteristic (having high reflectivity to visible light). Thereby, the light which is emitted in the organic EL layer 16 of each of the display pixels PIX is directly emitted in the visual field side (lower side in FIG. 4) via the pixel electrode 12 and the substrate 11 having light transparency characteristic, and is reflected by the counter electrode 17 having light reflecting property and the bottom emission type light emitting structure in which light is emitted in the visual field side via the pixel electrodes 12 can be realized.

At this time, as described above, the light emitted in the organic EL layer (light emitting layer) 16 is emitted in the visual field side via the transparent pixel electrode 12 and the transparent substrate 11 only. Therefore, for example, the shifting of chromaticity and the dispersion of light emitting brightness of each of the emission colors of R, G and B can be suppressed by suppressing the interference effect due to the film thickness distribution (unevenness in film thickness) of the gate insulation film which intervenes in the emission path (light path) of the light comparing to the display panel having the panel structure in which the pixel electrode is provided on the gate insulation film formed on the substrate, and a good display property without running, blurring and the like of image can be realized.

(Manufacturing Method of the Display Panel)

Next, a manufacturing method of the display panel according to the embodiment will be described.

FIGS. 5 to 9 are process sectional diagrams showing an example of a manufacturing method of the display panel according to the embodiment. Here, an outline of the manufacturing method will be described by showing a structure in which a portion of each part (transistor Tr12, capacitor Cs, organic EL element OLED, data line Ld, select line Ls, power voltage line Lv and the like) among the sectional structure of the display panel cut along the lines IVA-IVA and IVB-IVB shown in FIG. 4 and the terminal pad PLs provided at the end portion of the select line Ls and the terminal pad PLv provided at the end portion of the power voltage line Lv shown in FIG. 1 are conveniently extracted.

In the above manufacturing method of the display panel, first, the wiring layer of the transistors Tr11, Tr12, the capacitor Cs, the data line Ld, the select line Ls, the power voltage line Lv and the like of the pixel drive circuit DC is formed in the pixel forming region Rpx of the display pixel PIX (color pixels PXr, PXg and PXb) which is defined on one surface side of the insulative substrate 11 such as a glass substrate or the like as shown in FIGS. 1 and 3.

Figure 5A:
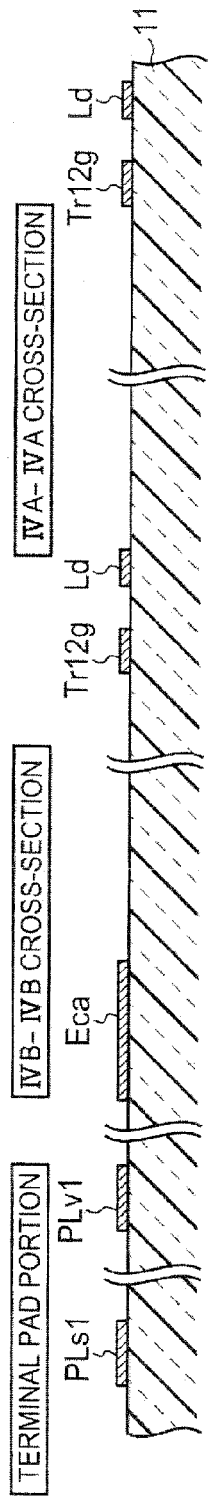
FIGS. 5A to 5D are process sectional diagrams showing an example of a manufacturing method of the display panel according to the embodiment (part 1)

In particular, as shown in FIG. 5A, the gate metal layer is formed on the substrate 11, and the gate electrodes Tr11g, Tr12g, the electrode Eca in one side of the capacitor Cs which is integrally formed with the gate electrode Tr12g, the data line Ld, the lower layer electrode layer PLs1 of the terminal pad PLs connected to the select line Ls and the lower layer electrode layer PLv1 of the terminal pad PLv connected to the power voltage line Lv are formed at the same time by patterning the gate metal layer by the wet-etching. At this time, the etching solution of acid system (for example, an etching solution of hydrofluoric acid) contacts the surface of the substrate 11 in the region in which the pixel electrode is formed. However, the etching solution will not carry out etching to the substrate 11 because a sufficient selection ration can be taken with respect to the glass.

Here, for example, a metal layer of aluminum (Al), titanium (Ti), vanadium (V), chromium (Cr), manganese (Mn), iron (Fe), cobalt (Co), nickel (Ni), copper (Cu), zinc (Zn), zirconium (Zr), niobium (Nb), molybdenum (Mo), palladium (Pd), silver (Ag), indium (In), tin (Sn), tantalum (Ta), tungsten (W), platinum (Pt) or gold (Au) in a simple form or compound or alloy including the above can be preferably used as the gate metal layer.

When the select line Ls and the power voltage line Lv are formed by a wiring structure in which a plurality of conductive layers are layered, the lower layer wiring layer of the select line Ls and the lower layer wiring layer of the power voltage line Lv (both are omitted from the drawing) are formed at the same time as the gate electrodes Tr11g, Tr12g and the like when the gate metal layer is being patterned. In such case, as shown in FIG. 3, at the areas where the select line Ls obtained by patterning the gate metal layer and the power voltage line Lv intersect with the data line Ld obtained by patterning the source/drain metal layer Ls-d, for example, the after-mentioned insulation film 13 is to be intervened between the data line Ld and the select line Ls and between the data line Ld and the power voltage line Lv without forming the lower layer wiring of the select line Ls and the power voltage line Lv by the gate metal layer so as not to be electrically connected with one another.

Figure 5B:
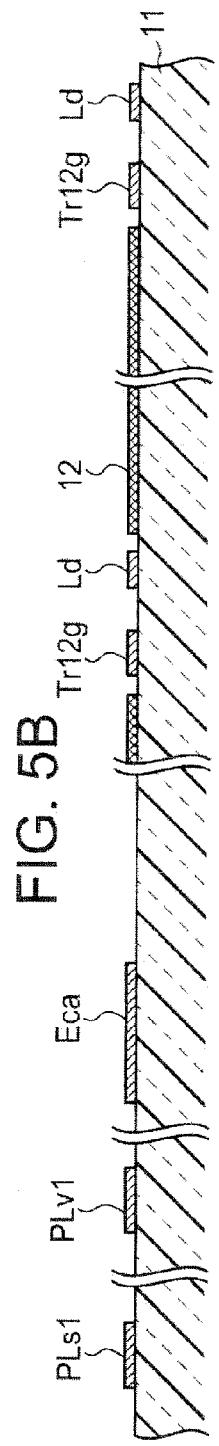

Next, after forming a conductive metal oxide layer (having a light transparency characteristic) in a thin film form which is constituted with transparent electrode material such as tin-doped indium oxide (Indium Tin Oxide; ITO), oxide of indium oxide and zinc oxide (Indium Zinc Oxide), tungsten-doped indium oxide (Indium Tungsten Oxide; IWO), tungsten-zinc-doped indium oxide (Indium Tungsten Zinc Oxide; IWZO) or the like on the substrate 11 including the gate electrodes Tr11g, Tr12g, the electrode Eca of the capacitor Cs, the data line Ld and the lower layer electrode layers PLs1, PLv1 by the spattering method or the like, the pixel electrode 12 having a predetermined planar shape (for example, rectangular shape) is formed at the EL element forming region Rel of each of the display pixels PIX by patterning the conductive metal oxide layer as shown in FIG. 5B.

Figure 5C:
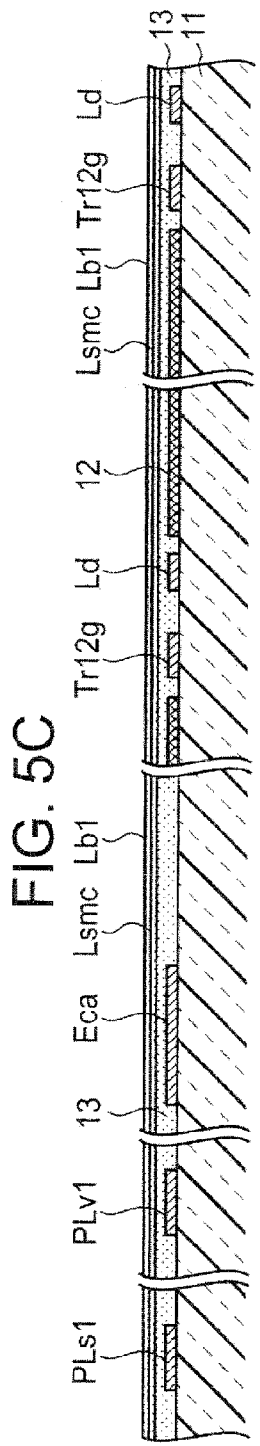
Figure 5D:
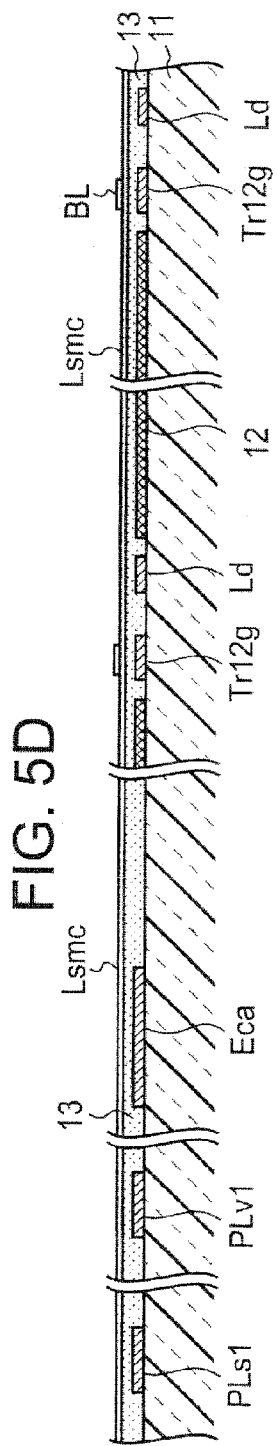

Then, as shown in FIG. 5C, for example, the gate insulation film 13 constituted with silicon nitride, silicon oxide or the like, the semiconductor layer Lsmc constituted with amorphous silicon or the like and the insulation layer Lbl constituted with nitride silicon or the like are formed by being orderly layered by using the chemical vapor deposition method (CVD method) or the like so as to cover the entire region of the substrate 11 including the gate electrodes Tr11g, Tr12g, the pixel electrode 12 and the like. Thereafter, as shown in FIG. 5D, the channel protection layer (block layer) BL constituted with silicon nitride or the like is formed at the region corresponding to the gate electrodes Tr11g, Tr12g by patterning the insulation layer Lbl which is the top layer by using the photoresist mask (omitted from the drawing).

Subsequently, as shown in FIG. 6A, after the $n^+$silicon layer Lohm in which the impurity is doped is formed by using the CVD method or the like, for example, so as to cover the entire region of the substrate 11, an opening from which the pixel electrode 12 is exposed at the EL element forming region Rel within each of the pixel forming regions Rpx, the contact hole CH11 (see FIG. 3) from which only upper surface of a specific region of the data line Ld is exposed, the contact holes CH12, CH13 (see FIG. 3) from which only upper surface of each specific region of the gate electrodes Tr11g, Tr12g is respectively exposed and the openings CHs1, CHv1 from which only the lower layer electrode layers PLs1, PLv1 of the terminal pad portions are exposed are formed by continuously carrying out the dry-etching to the $n^+$silicon layer Lohm, the semiconductor layer Lsmc and the gate insulation film 13 by using the gas mixture of oxygen and $SF_6$. In such case, the shape of the opening from which only the pixel electrode 12 is exposed is defined by the shape of the end portion 13a of the gate insulation film 13, the semiconductor layer Lsmc and the $n^+$silicon layer Lohm. At this time, a region of the substrate 11 which positions at the lower surface of the pixel electrode 12 can maintain a smooth condition without being exposed to the etchant of the dry-etching because the region of the substrate 11 is covered by the pixel electrode 12.

Next, as shown in FIG. 6B, the source/drain metal layer Ls-d is formed on the entire region of the substrate 11. Here, for example, a metal layer of aluminum (Al), titanium (Ti), vanadium (V), chromium (Cr), manganese (Mn), iron (Fe), cobalt (Co), nickel (Ni), copper (Cu), zinc (Zn), zirconium (Zr), niobium (Nb), molybdenum (Mo), palladium (Pd), silver (Ag), indium (In), tin (Sn), tantalum (Ta), tungsten (W), platinum (Pt) or gold (Au) in a simple form or compound or alloy including the above can be preferably used as the source/drain metal layer Ls-d similarly as the above described gate metal layer. As for a particular example, the source/drain metal layer Ls-d may be formed with a single layer or an alloy layer of aluminum alloy such as simple aluminum (Al), aluminum-titanium (AlTi), aluminum-meodymium-titanum (AlNdTi), copper (Cu) or the like for reducing the wiring resistance, or the source/drain metal layer Ls-d may have a laminate structure in which the transition metal layer for reducing migration such as chromium (Cr), titanium (Ti) and the like is provided at the lower layer of the low resistant metal layer.

Thereafter, the mask MSK which is patterned on the source/domain metal layer is formed. By carrying out the etching to the source/drain metal layer Ls-d by using the mask MSK, each of the source electrodes Tr11s, Tr12s of the transistors Tr11, Tr12, the drain electrodes Tr11d, Tr12d and the electrode Ecb in the other side of the capacitor Cs, the select line Ls and the upper layer electrode layer PLs2 of the terminal pad PLs which is connected to the select line Ls, and the power voltage line Lv and the upper electrode layer PLv2 of the terminal pad PLv which is connected to the power voltage line Lv are formed at the same time, respectively.

Subsequently, the semiconductor layer SMC having a channel region in the region corresponding to the gate electrodes Tr11g, Tr12g on the gate insulation film 13 is formed by continuously carrying out the etching to the n+silicon layer Lohm and the semiconductor layer Lsmc by using the source electrodes Tr11s, Tr12s, the drain electrodes Tr11d, Tr12d, the electrode Ecb of the capacitor Cs, the select line Ls, the power voltage line Lv, the upper layer electrode layer PLs2 and the upper layer electrode layer PLv2 as the mask as shown in FIG. 6C. Further, the impurity layer OHM is formed between the semiconductor layer SMC and the source electrodes Tr11s, Tr12s and between the semiconductor layer SMC and the drain electrodes Tr11d, Tr12d.

In such way, the transistors Tr11, Tr12 which have the semiconductor layer SMC on the gate electrodes Tr11g, Tr12g via the gate insulation film 13 and which have the source electrodes Tr11s, Tr12s and the drain electrodes Tr11d, Tr12d at both ends of the channel region via the impurity layer OHM are formed. At this time, as shown in FIG. 3, the drain electrode Tr11d of the transistor Tr11 is connected to the data line Ld via the contact hall CH11 formed at the gate insulation film 13, and the source electrode Tr11s of the transistor Tr11 is connected to the gate electrode Tr12g of the transistor Tr12 via the contact hole CH13 formed at the gate insulation film 13. Further, one end of the source electrode Tr12s extends onto the pixel electrode 12 and they are electrically connected to each other, and the upper surface of the pixel electrode 12 is exposed again except for the connecting portion with the source electrode Tr12s.

Moreover, from the above process, the n+silicon layer Lohm and the semiconductor layer Lsmc are formed so as to intervene between the gate insulation film 13 and the electrode Ecb of the capacitor Cs, the select line Ls and the power voltage line Lv and between the gate insulation film 13 and the upper layer electrode layer PLs2 and the upper layer electrode layer PLv2. At this time, the select line Ls is connected to the gate electrode Tr11g of the transistor Tr11 via the contact hole CH12 provided at the gate insulation film 13. Further, the power voltage line Lv is integrally formed with the drain electrode Tr12d of the transistor Tr12.

Moreover, the capacitor Cs is formed by the electrode Eca which is integrally formed with the gate electrode Tr12g and the electrode Ecb (including n+silicon layer Lohm and semiconductor layer Lsmc) which is integrally formed with the source electrode Tr12s being dispoase so as to oppose to one another by having the gate insulation film 13 in between which is a dielectric material. Further, at the terminal pad portion, the upper layer electrode layer PLs2 and the lower layer electrode layer PLs1, and the upper layer electrode layer PLv2 and the lower layer electrode layer PLv1 are respectively electrically connected to one another via the openings CHs1 and CHv1 formed at the n+silicon layer Lohm, the semiconductor layer Lsmc and the gate insulation film 13 to form the terminal pads PLs, PLv.

Next, as shown in FIG. 7A, for example, the insulation layer Lisl constituted with a non-organic insulative material such as silicon oxide film, silicon nitride film or the like by the CVD method or the like on the substrate 11 on which the transistors Tr11, Tr12, the select line Ls, the power voltage line Lv and the like are formed and from which the pixel electrode 12 is exposed. Thereafter, by patterning the insulation layer Lisl, the inter-layer insulation film 14 to electrically insulate the region (or the region between the pixel electrodes 12; the bordering region) between the EL element forming regions Rel of the display pixels PIX adjacent to one another arranged in the row direction (left-right direction in FIGS. 1 and 3) of the display panel 10 is formed. Further the opening from which the pixel electrode 12 is exposed to the EL element forming region Rel of each of the display pixels PIX and the openings CHs2, CHv2 from which the upper layer electrode layers PLs2, PLv2 are exposed at the terminal pad portion are formed. In such case, the shape of the opening from which the pixel electrode 12 is exposed is defined by the shape of the end portion 14a of the inter-layer insulation film 14.

Next, as shown in FIG. 8A, the bank 15 constituted with a photosensitive resin material such as polyimide, acrylic or the like is formed on the inter-layer insulation film 14 formed at the bordering region between the adjacent display pixels PIX (pixel electrodes 12). Particularly, by patterning the photosensitive resin layer which is formed so as to cover the entire region of one surface side of the substrate 11 including the inter-layer insulation film 14, the bank (partition wall) 15, which is a bordering region between display pixels PIX which are adjacent in the row direction, which is continuously protruded in the height direction and which has a palisaded planar shape including the region which extends in the line direction of the display panel 10 is formed as shown in FIG. 1. In such way, the EL element forming regions Rel of a plurality of display pixels (color pixels) PIX of the same color which are arranged in the line direction of the display panel 10 are defined by being enclosed by the bank 15 and the inter-layer insulation film 14, and the upper surface of the pixel electrode 12 of each display pixels PIX are exposed within the EL element forming region Rel.

Next, after the substrate 11 is cleansed with pure water, a treatment to make the surface of each of the pixel electrodes 12 which are exposed at the EL element forming region Rel have a lyophilic characteristic to the organic compound containing solution of the after-mentioned hole transporting material and electron transporting light emitting material by carrying out the oxygen plasma treatment, the UV ozone treatment or the like, for example. Then, the $CF_4$ plasma treatment is carried out to the surface of the bank 15, and a treatment to selectively make the surface of the bank 15 have a repellency characteristic to the organic compound containing solution is carried out. Here, the above mentioned repellency treatment does not need to be carried out as long as fluorine atoms or functional group including fluorine atoms is included in the resin material itself which forms the bank 15 in advance.

Thereby, on the same substrate 11, the repellency treatment is carried out to the surface of the bank 15 and the surface of the pixel electrode 12 which is exposed at each of the pixel forming regions Rpx formed by the bank 15 remain to be in a not-repellent state (lyophilic) Therefore, as described afterwards, the organic compound containing solution can be prevented from leaking or coming over to the adjacent EL element forming regions Rel even when the organic EL layer 16

(electron transporting light emitting layer 16*b*) is formed by applying the organic compound containing solution, and the colors of red (R), green (G) and blue (B) can be separately colored by suppressing the color mixing of the adjacent pixels.

Here, "repellency" used in the embodiment is defined as a condition in which the contact angle is larger or equal to 50 degrees when the organic compound containing solution containing the hole transporting material which becomes the after-mentioned hole transporting layer 16, the organic compound containing solution containing the electron transporting light emitting material which becomes the electron transporting light emitting layer 16*b* or the organic solvent used in such solutions is dropped on the substrate or the like and the contact angle is measured. Further, in the embodiment, "lyophilic" which opposes to "repellency" is defined as a condition where the above contact angle is smaller or equal to 40 degrees, preferably smaller or equal to 10 degrees.

Next, as shown in FIG. 8B, after applying a solution or a dispersion liquid of the hole transporting material constituted with organic material of polymer system to the EL element forming region Rel of each colors which are enclosed (defined) by the bank 15 by using the ink-jet method, the nozzle printing method or the like which has good process controllability and productivity, the solution is heated and dried to form the hole transporting layer 16*a*. Then, after applying a solution or a dispersion liquid of the electron transporting light emitting material constituted with organic material of polymer system corresponding to the luminescent colors of R, G and B on the hole transporting layer 16*a*, the solution is heated and dried to form the electron transporting light emitting layer 16*b*. In such way, as shown in FIG. 9A, the organic EL layer 16 in which at least the hole transporting layer 16*a* and the electron transporting light emitting layer 16*b* are formed on the pixel electron 12 is formed by layering.

Particularly, the hole transporting layer 16*a* which is the carrier transporting layer is formed by fixing the hole transporting material of organic polymer system on the pixel electrode 12 by removing solvent by carrying out the drying process by heating after applying polyethylenedioxythiophene/polystyrenesulphonic acid aqueous solution (PEDOT/PSS; a dispersion liquid in which polyethylenedioxythiophene PEDOT which is the conductive polymer and polystyrenesulphonic acid PSS which is a dopant are dispersed in aqueous medium) on the pixel electrode 12 as the organic compound containing solution including the hole transporting material of organic polymer system, for example.

Moreover, as for the organic compound containing solution including electron transporting light emitting material of organic polymer system, for example, a solution in which a luminescent material including conjugate double bond polymer of polyparaphenylene vinylene system, polyfluorene system or the like is dissolved in an organic solvent such as tetralin, tetramethylbenzene, mesitylene, xylene or the like or water is applied on the hole transporting layer 16*a*. Thereafter, the drying process by heating is carried out to remove the solvent in order to fix the electron transporting light emitting material of organic polymer system on the hole transporting layer 16*a* to form the electron transporting light emitting layer 16*b* which is a carrier transporting layer and also a light emitting layer.

Then, as shown in FIG. 9B, a common counter electrode (for example, cathode electrode) 17 which opposes to the pixel electrode 12 of each of the display pixels PIX having a light reflecting characteristic is formed at least on the substrate 11 including the EL element forming region Rel of each of the display pixels PIX via the organic EL layer 16 (hole transporting layer 16*a* and electron transporting light emitting layer 16*b*).

Particularly, the counter electrode 17 may have an electrode structure in which a thin film (power supplying electrode) of high work function such as an alloy of aluminum (Al), chromium (Cr), silver (Ag) or palladium-silver (AgPd), ITO or the like having a film thickness of greater or equal to 100 nm is formed so as to be layered on the electron injection layer after the electron injection layer (cathode electrode) of low work function such as calcium (Ca), barium (Ba), lithium (Li), indium (In) or the like having a film thickness of about 1 to 10 nm is formed by using the vacuum deposition method or the spattering method, for example. Here, the counter electrode 17 is formed as a single conductive layer (solid electrode) which extends not only to the region opposing to the pixel electrode 12 exposed at each EL element forming region Rel but also onto the bank 15 which defines each EL element forming region Rel as shown in FIGS. 1, 4A and 4B.

Next, after the counter electrode 17 is formed, the sealing layer 18 constituted with silicon oxide film, silicon nitride film or the like is formed on the entire region of one surface side of the substrate 11 as a protection insulation film (passivation film) by using the CVD method or the like to complete the display panel 10 having a section structure (light emitting structure of bottom emission type) as shown in FIGS. 4A and 4B. Here, in addition to the above sealing layer 18 or instead of the sealing layer 18, a metal cap (sealing cap) or a sealing substrate such as glass may be joined by using the UV curing or the heat curing.

In such way, in the manufacturing method of the display panel according to the embodiment, the pixel electrode 12 of the organic EL element OLED which is provided at each display pixels PIX is directly formed on the substrate 11 prior to the patterning process of the gate insulation film 13 of the transistors Tr11, Tr12, and then, the source electrode Tr12*s* of the transistor Tr12 which is to be formed on the gate insulation film 13 is directly connected to the pixel electrode 12.

That is, the pixel electrode 12 functions as an etching protection film (stopper) with respect to the substrate 11 which positions below when the dry-etching is carried out to the gate insulation film 13 by forming an opening from which the pixel electrode 12 is exposed at each EL element forming regions Rel by carrying out the etching to the gate insulation film 13 which is formed on the pixel electrode 12 so as to cover the pixel electrode 12 after the pixel electrode 12 is formed on the substrate 11. Therefore, for example, damage such as the smoothness of the substrate surface being impaired (being rough) or the like can be reduced comparing to a case where the pixel electrode is formed after the opening is formed by carrying out the etching to the gate insulation film which is formed on the substrate so as to cover the substrate.

Therefore, phenomenon in which the light emitted in the organic EL layer of each of the display pixels PIX is scattered at the substrate surface and in which dispersion occurs in interference due to dispersion of thickness of the substrate at the time of light emitting operation of the display panel (organic EL element) can be suppressed. Thus, a display panel having a good display property which does not have running, blurring and the like of the image can be realized by suppressing the shifting of chromaticity and the dispersion of light emitting brightness (emitting intensity).

In addition, the gate insulation film is not intervened between the pixel electrode constituted with a transparent electrode and the transparent substrate. Therefore, the shifting of chromaticity and the dispersion of light emitting brightness can be suppressed in the light emitted from the substrate and a good display property without running, blurring and the like of the image can be realized because there is no dispersion in the interference color due to unevenness in the film thickness of the gate insulation film when the light which the organic EL layer (light emitting layer) of the display pixel PIX emits inters between the pixel electrode and the transparent substrate comparing to the case where the gate insulation film is intervened between the pixel electrode and the substrate, for example.

Here, in the above described embodiment, a case where the organic EL layer 16 is structured with a plurality of carrier transporting layers which are constituted with the hole transporting layer 16a and the electron transporting light emitting layer 16b is described. However, the combination of the carrier transporting layer in the present invention is not limited to this. For example, a layer having the hole transporting layer and the electron transferring light emitting layer in one, a combination of a hole transporting light emitting layer and an electron transporting layer, or a combination of a three layer of a hole transporting layer, an electron transporting layer and a light emitting layer may be applied. Further, a carrier transporting control layer to control the transportation of the carrier such as an inter-layer layer may be arbitrarily intervened between each of the layers as the carrier transporting layer, and also other combination of carrier transporting layer may be applied.

Moreover, in the above described embodiment, a description is given for the case where the pixel electrode 12 is the anode electrode of the organic EL element OLED, the counter electrode 17 is the cathode electrode, the hole transferring layer 16a is formed in the pixel electrode 12 side and the electron transporting light emitting layer 16b is formed in the counter electrode 17 side. However, the present invention is not limited to this. The pixel electrode 12 may be a transparent cathode electrode of the organic EL element and the counter electrode 17 may be a non-transparent anode electrode. In this case, the element structure will be such that the electron transporting light emitting layer 16b is formed in the pixel electrode 12 side and that the hole transporting layer 16a is formed in the counter electrode 17 side.

Furthermore, the bottom emission type in which the transparent electrode is disposed on the substrate is applied in the above embodiment. However, even when the top emission type in which the light of the organic EL layer is emitted from the counter electrode 17 side is applied, the electrode and the organic EL layer can be formed on the substrate so as to have even thickness and the dispersion of scattering of light, the dispersion of the interference of light or the like can be suppressed because there is no undulation on the surface of the substrate due to the etching in the above manufacturing process. In case of such top emission structure, the pixel electrodes do not have to be transparent, and only the reflection conductor film may be used or a combination of a transparent conductor film and a reflection film also may be used.

Moreover, the dry-etching is carried out by using the gas mixture of oxygen and $SF_6$ in the above embodiment. However, the gas which is used is not limited to this as long as the gas erodes the substrate.

According to the display panel and the manufacturing method of the display panel of the present invention, a good display property without running or blurring of the image can be realized by the dispersion in the shifting of chromaticity and the light emitting brightness (emission intensity) being suppressed.

The entire disclosure of Japanese Patent Application No. 2007-308189 filed on Nov. 29, 2007 including description, claims, drawings, and abstract are incorporated herein by reference in its entirety.

Although various exemplary embodiments have been shown and described, the invention is not limited to the embodiments shown. Therefore, the scope of the invention is intended to be limited solely by the scope of the claims that follow.

What is claimed is:

1. A manufacturing method of a display panel which comprises a light emitting element including a first electrode, a carrier transporting layer constituted of at least one layer, and a second electrode, the method comprising:

forming the first electrode in a predetermined region on a substrate;

forming an insulation film, a first semiconductor layer, and a second semiconductor layer in which an impurity is doped so as to cover an entire region of the substrate on which the first electrode is formed, wherein the insulation film, the first semiconductor layer, and the second semiconductor layer are layered in this order;

forming an opening from which only a predetermined region of the first electrode is exposed by continuously patterning the second semiconductor layer, the first semiconductor layer, and the insulation film with an etching gas; and forming the carrier transporting layer at least on the first electrode which is exposed from the opening.

2. The manufacturing method of the display panel according to claim 1, wherein the insulation film comprises a silicon nitride or a silicon oxide.

3. The manufacturing method of the display panel according to claim 2, wherein the etching gas is a gas mixture of oxygen and $SF_6$.

4. The manufacturing method of the display panel according to claim 1, wherein the insulation film in which the opening is formed includes a gate insulation film of a transistor.

5. The manufacturing method of the display panel according to claim 4, further comprising:

forming at least one of a source electrode and a drain electrode of the transistor after the first electrode is formed.

6. The manufacturing method of the display panel according to claim 1, wherein the insulation film in which the opening is formed includes an inter-layer insulation film.

7. The manufacturing method of the display panel according to claim 6, further comprising:

forming a bank on the inter-layer insulation film by patterning a photosensitive resin layer.

8. The manufacturing method of the display panel according to claim 7, further comprising:

making a surface of the first electrode have a lyophilic characteristic to an organic-compound-containing solution by cleansing the substrate with pure water and by carrying out an oxygen plasma treatment or an UV ozone treatment after the bank is formed.

9. The manufacturing method of the display panel according to claim 8, further comprising:

making a surface of the bank have a repellency characteristic to the organic-compound-containing solution after the first electrode is made to have the lyophilic characteristic.

10. The manufacturing method of the display panel according to claim 9, wherein the carrier transporting layer is formed by applying the organic-compound-containing solution after the surface of the bank is made to have the repellency characteristic.

11. The manufacturing method of the display panel according to claim 10, further comprising:

forming the second electrode on the carrier transporting layer after the carrier transporting layer is formed.

12. The manufacturing method of the display panel according to claim 4, further comprising:

forming a gate electrode of the transistor on the substrate by carrying out a wet-etching using an etchant of an acid series before the first electrode is formed.

13. A manufacturing method of a display panel which comprises a light emitting element including a first electrode, a carrier transporting layer constituted of at least one layer, and a second electrode, the manufacturing method layering the first electrode, the carrier transporting layer and the second electrode, the manufacturing method comprising:

forming the first electrode in a predetermined region on a substrate;

forming an insulation film, a first semiconductor layer, and a second semiconductor layer in which an impurity is doped so as to cover an entire region of the substrate on which the first electrode is formed, wherein the insulation film, the first semiconductor layer, and the second semiconductor layer are layered in this order;

removing the insulation film, the first semiconductor layer, and the second semiconductor layer which are on the first electrode by continuously patterning the second semiconductor layer, the first semiconductor layer, and the insulation film with an etching gas;

forming the carrier transporting layer on the first electrode; and forming the second electrode on the carrier transporting layer.

* * * * *